United States Patent
Condie et al.

(10) Patent No.: US 7,042,103 B2
(45) Date of Patent: May 9, 2006

(54) LOW STRESS SEMICONDUCTOR DIE ATTACH

(75) Inventors: Brian W. Condie, Mesa, AZ (US); David J. Dougherty, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 90 days.

(21) Appl. No.: 10/334,042

(22) Filed: Dec. 30, 2002

(65) Prior Publication Data

US 2004/0124543 A1 Jul. 1, 2004

(51) Int. Cl.
*H01L 23/52* (2006.01)

(52) U.S. Cl. ............ 257/782; 257/778; 257/779; 257/663; 257/676; 257/674; 257/783; 257/773

(58) Field of Classification Search ........... 257/778, 257/782, 779, 663, 676, 674, 783, 773
See application file for complete search history.

(56) References Cited

U.S. PATENT DOCUMENTS

| | | | |
|---|---|---|---|
| 4,918,511 A | 4/1990 | Brown | 357/70 |
| 4,952,999 A | 8/1990 | Robinson et al. | 357/68 |
| 5,075,254 A | 12/1991 | Robinson et al. | 437/209 |
| 5,350,662 A | 9/1994 | Chi | 430/313 |
| 5,378,926 A | 1/1995 | Chi et al. | |
| 5,409,863 A * | 4/1995 | Newman | 29/827 |
| 5,435,732 A * | 7/1995 | Angulas et al. | 439/67 |
| 5,483,092 A * | 1/1996 | Kosaki | 257/276 |
| 5,773,878 A | 6/1998 | Lim et al. | 257/676 |
| 5,804,880 A | 9/1998 | Mathew | 257/779 |
| 5,825,093 A * | 10/1998 | Guo et al. | 257/782 |
| 6,169,322 B1 | 1/2001 | Chang et al. | 257/663 |
| 6,184,560 B1 | 2/2001 | Kawai | 257/415 |
| 6,672,947 B1 * | 1/2004 | Tsao et al. | 451/57 |
| 6,687,987 B1 * | 2/2004 | Mayer et al. | 29/832 |
| 2002/0182385 A1 * | 12/2002 | Senkevich et al. | 428/209 |

FOREIGN PATENT DOCUMENTS

EP 0023534 * 11/1981

* cited by examiner

*Primary Examiner*—Eddie C. Lee
*Assistant Examiner*—Junghwa Im
(74) *Attorney, Agent, or Firm*—John A. FortKort; FortKort & Houston P.C.

(57) ABSTRACT

A semiconductor device (121) is provided which comprises a substrate and a die (123) having a first surface which is attached to the substrate by way of a die attach material. At least a portion (127) of the perimeter of the die is resistant to wetting by the die attach material, either through treatment with a dewetting agent or by selective removal of the backside metallization. It is found that this construction allows the surface area of the die to be increased without increasing the incidence of cracking and chipping along the sawn edges of the die.

20 Claims, 6 Drawing Sheets

LOW STRESS SEMICONDUCTOR DIE ATTACH

FIELD OF THE INVENTION

The present invention relates generally to semiconductor die attach, and in particular to methods and designs for reducing the stress attendant to die attach.

BACKGROUND OF THE INVENTION

Semiconductor die attach operations are common in the industry and typically occur after the dicing or sawing of a semiconductor wafer into individual die. One common die attach operation involves the attachment of a semiconductor die to a packaging substrate, typically by way of a solder joint at a metal die pad, to produce a packaged die.

FIGS. 1 and 2 are illustrations of a typical prior art packaged die 100. As seen therein, a first surface of the die 101 (SEE FIG. 1) is attached in its entirety to a second surface of a die pad 102 with a die attach material 103 (see FIG. 1) such as solder. Bond pads 107 (see FIG. 1) are formed on a second surface of the die opposite the first surface. A set of bond wires 105 are attached to a bond pad on the die and to one of a set of leads 104 formed proximate to the die. The die, die pad, die attach material, bond wires and the inner portion of the leads are encapsulated by an encapsulant 106. As shown in FIG. 2, the encapsulant serves to hold the die, die pad, leads, and other components of the packaged die together in an integral structure that can be handled and processed as a unitary mass.

A packaged die of the type shown in FIGS. 1 and 2 is typically subjected to heating at one or more points during its manufacture. For example, during solder-based die attach, the die and the die pad are typically subjected to temperatures that are sufficiently high (e.g., greater than about 220° C.) to effect solder reflow. Such heating results in the presence of significant thermally induced stresses in the die. Similarly high temperatures are often encountered in adhesive die attach operations as well.

One type of thermally induced stress present in the die may be referred to as "differential CTE stress", and arises from the mating together during die attach of materials having different coefficients of thermal expansion (CTEs). This effect is shown in FIGS. 3 and 4 for a die attach operation involving the attachment of a die 201 to a packaging substrate 203.

As shown in FIG. 3, at the assembly temperature, the die attach material 205, which is typically a solder or an adhesive, exists as a liquid. Consequently, the die 201 and substrate 203 are not rigidly bound together at this temperature, and may expand or shrink independently of each other as a function of temperature without the creation of stress. Below the solidification temperature of the die attach material, however, the die and substrate are more rigidly coupled together, and can no longer expand or contract independently of each other. Consequently, the presence of CTE differentials between the die and the substrate result in the presence of differential CTE stresses in the packaged die as the package is cooled below the solidification temperature, so that the cooling of the packaged die to room temperature after die attach results in the presence of significant differential CTE stresses in the packaged die. When the CTE of the packaging substrate is higher than that of the die, this cooling can cause bending in the packaged die as seen in FIG. 4.

The presence of differential CTE stress in the packaged die also induces shear stress and bending deformation. The amount of shear stress present in the package increases as a function of the cross-sectional surface area of the surfaces joined together by the die attach material. As shear stress increases, it may result in cracking or chipping of the die. The die is especially prone to cracking or chipping at places along its perimeter where it was sawn from the wafer, due to the presence of crack propagation sites there. An example of such cracking is shown in REGION 5 of the die in FIG. 5. This phenomenon can be a major source of yield loss in packaged die, especially in thinner die (e.g., die having a thickness of less than about 40 microns).

In order to achieve acceptable yields of the packaged product, the surface area of the die must typically be maintained below values that are optimal for many applications so that the attendant shear stress (and attendant yield loss) will not be excessive. Consequently, in such applications it is often necessary to utilize several smaller die, rather than one or a few larger die, thus complicating the assembly process. It is also often necessary in such applications to alleviate shear stress by choosing materials of more compatible CTE, but this frequently comes at a price of lower thermal performance due to the typically low thermal conductivity of such materials. Moreover, such an approach limits the use of metals such as copper for the die pad. However, the use of copper and other such metals in the die pad is otherwise advantageous due to the higher thermal conductivities and lower cost of these metals.

There is thus a need in the art for a method for relieving differential CTE stresses in die, especially during die attach. There is further a need in the art for a method for making a packaged die that permits the use of larger die and of die pad materials, such as copper, which have high thermal conductivities, without increased incidence of cracking or chipping in the die. These and other needs are met by the devices and methodologies described herein.

SUMMARY OF THE INVENTION

In one aspect, a semiconductor device is provided herein which comprises a substrate and a die having a first surface which is attached to the substrate by way of a die attach material, wherein at least a portion of the perimeter of the die is resistant to wetting by the die attach material. The substrate may be, for example, a packaging substrate. In some embodiments, the die attach material is a solder, and the first surface of the die has a metallization layer thereon that is not present in (or that has been removed from) the portion of the perimeter of the die that is resistant to wetting by the solder composition. In other embodiments, at least a portion of the perimeter of the die has a dewetting agent disposed thereon. Preferably, the dewetting agent is disposed along the perimeter of any sawn edges on the die. When the die attach material is a metal solder, the dewetting agent may be a refractory metal or a metal oxide such as $TiO_2$. When the die attach material is an adhesive, the dewetting agent may comprise, for example, a fatty acid.

In another aspect, a semiconductor device is provided herein which comprises a die package and a die having a first surface which is attached to said die package by way of a solder composition, wherein at least a portion of the perimeter of the die has a dewetting agent disposed thereon. The die may have a thickness of less than about 40 microns. In one particular embodiment, the solder composition comprises AuSn, the die comprises GaAs, and the dewetting agent comprises a metal oxide such as $TiO_2$ or a refractory metal. The die may further comprise a source via, and the dewetting agent may also be disposed over or around the source via, in which case the dewetting agent is preferably patterned as a first portion which is disposed as a band around the perimeter of the die, and a second portion, separate from the first portion, which is disposed about the source via. The dewetting agent is preferably disposed about the entire perimeter of the first surface of the die.

In still another aspect, a device is provided which comprises a die and a dewetting agent disposed about the perimeter of said die.

In yet another aspect, a method for making a semiconductor device is provided. In accordance with the method, a semiconductor die is provided, and a dewetting agent is disposed on the die such that the dewetting agent extends about the perimeter of the die, thereby forming a treated die. A solder composition is then disposed onto the treated die. The die may have a source contact disposed thereon, in which case the dewetting agent may be disposed on the die such that it covers the perimeter of the die and the source contact. The method may further comprise the step of depositing a layer of gold on the semiconductor substrate prior to disposing the dewetting agent thereon, and the dewetting agent may be patterned such that at least a portion of the layer of gold is exposed.

In still another aspect, a method for making a semiconductor device is provided. In accordance with the method, a semiconductor substrate is provided which has a source contact disposed thereon. A layer of metal is then disposed onto the substrate such that the metal extends about the perimeter of the substrate and is in electrical contact with the source contact. The metal is then oxidized, and a solder composition is disposed onto the substrate. The semiconductor substrate may comprise GaAs.

These and other aspects of the present disclosure are described in greater detail below.

DETAILED DESCRIPTION

It has now been found that the surface area of a die can be increased, without increasing the incidence of cracking and chipping along the sawn edges of the die, through the provision of a material along the perimeter of the die so that, during die attach, the die attach material will not wet or adhere to the die along its perimeter. In some embodiments, especially when the die attach material is a solder, a similar result may be achieved through selective removal of the backside metallization from the die.

Without wishing to be bound by theory, it is believed that shear stress is the principle driver for vertical crack failures in many die attach operations, particularly those involving GaAs die. It is further believed that cracking or chipping of the die along its perimeter occurs both because shear stress is maximized there, and because the die perimeter typically contains a number of crack propagation sites as a result of the dicing operation performed at the wafer level. Moreover, in the case of beveled die, the die is thinnest along its perimeter. The perimeter of the die is especially thin when the die itself is thin (e.g., less than about 40 microns). Hence, by preventing die attach along these areas and, more particularly, by limiting die attach to the interior of the die, the shear stress maxima can be made to occur over an area closer to the center of the die, where the die is an order of magnitude stronger (and thus better able to resist cracking or chipping).

Figure 1:
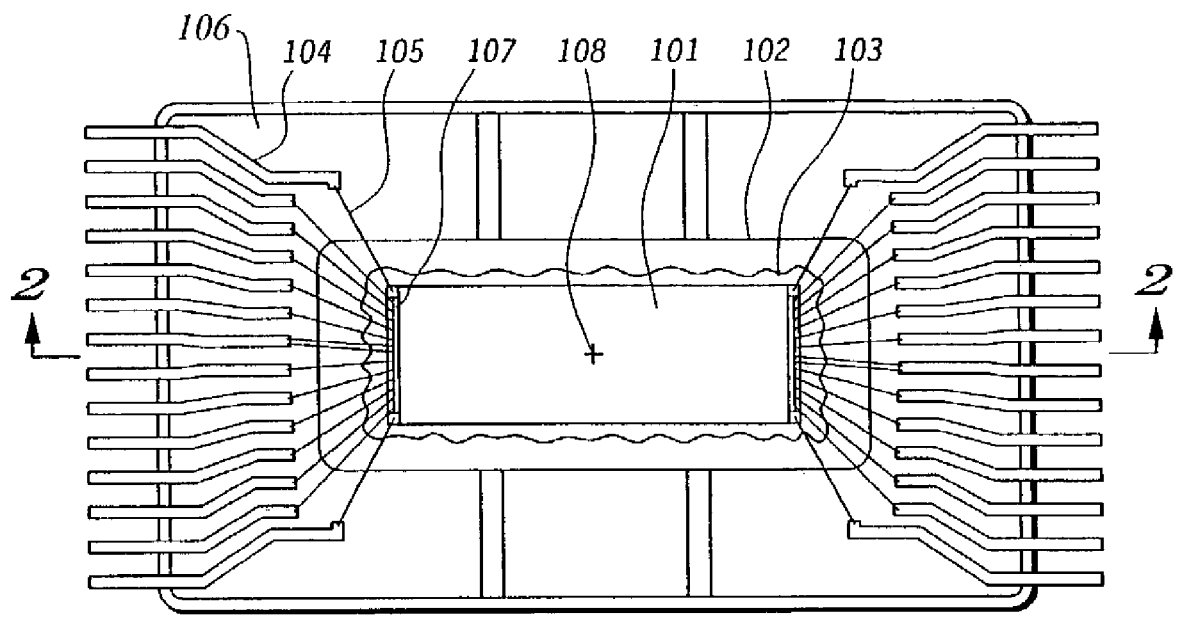
FIG. 1 is an illustration of a prior art packaged die.
Figure 2:
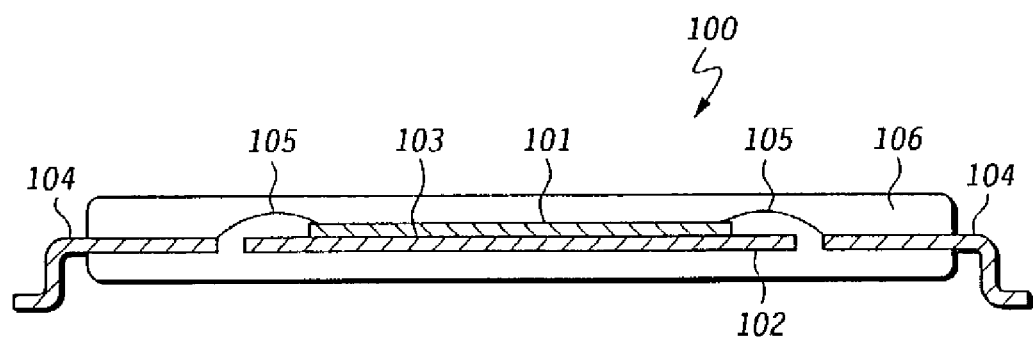
FIG. 2 is a cross-section of the prior art packaged die of FIG. 1 taken along LINE 2—2.
Figure 3:
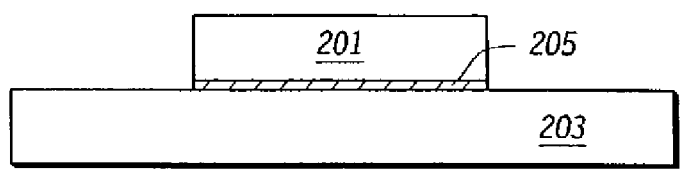
FIGS. 3 and 4 are illustrations depicting the effect during thermal cycling of CTE differentials in a die attached to a substrate.
Figure 4:
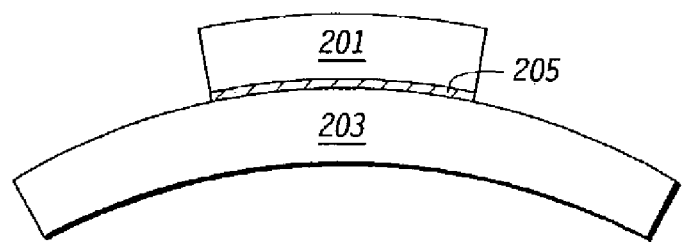
Figure 5:
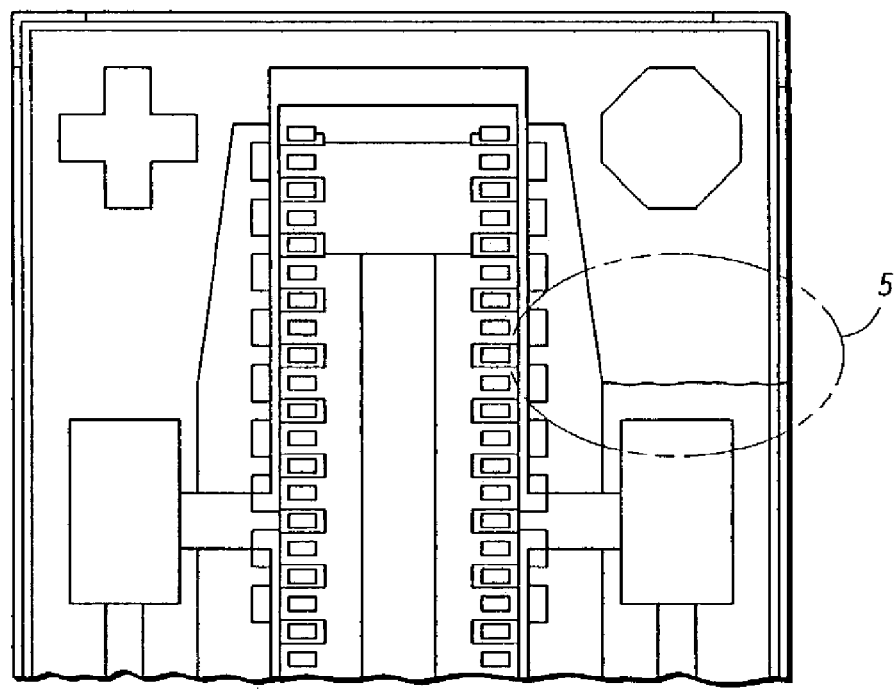
FIG. 5 is an illustration showing the presence of thermally induced cracking in a prior art die.
Figure 6:
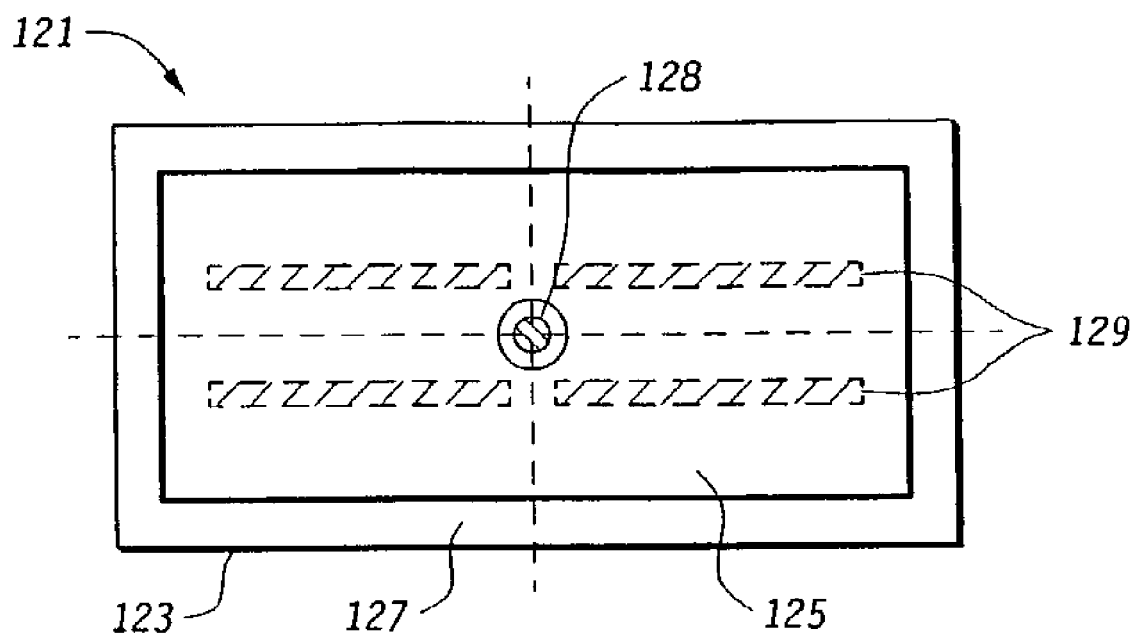
FIG. 6 is an illustration of a dewetting scheme for a die made in accordance with the teachings herein.

FIG. 6 illustrates one example of a device made in accordance with the teachings herein. The device 121 depicted therein consists of a die 123 having a first area 125 where the solder wets the die back metal and a second area 127 along the perimeter of the die and around the source via 128 which has been treated with a dewetting agent and which is therefore not wet by the solder. The die has a plurality of active areas 129 disposed upon it. As FIG. 6 indicates, the first area 125 is centered on the die. Consequently, the solder bond is confined to the interior of the die, thus shifting the location of the shear stress maxima toward the interior of the die as described above. Moreover, the first area extends over that portion of the die surface which is directly opposite the active areas disposed on the other side of the die. This arrangement is advantageous from a heat dissipation perspective.

In embodiments of the type depicted in FIG. 6 and for which solder is used as the die attach material, die attach can be restricted to the interior of the die through the provision of a metal (such as a refractory metal) or metal oxide along the perimeter of the die as a dewetting agent such that, during die attach with a solder, the solder will not wet the die along its perimeter. Such an embodiment is depicted in the micrograph of FIG. 7, where a layer of $TiO_2$ 133 has been deposited around the perimeter of the die 131 depicted therein and over the gold back metallization 135 already present on the die.

The area of the die covered by the dewetting agent is preferably of essentially uniform width. Preferably, this width is at least about 1 mil (25.4 microns), more preferably at least about 3 mils (76 microns), and most preferably at least about 6 mils (152 microns), but is preferably not large enough to create thermal penalties. The dewetting agent may be applied (or, as the case may be, the backside metallization is selectively removed) before application of the solder or other die attach material.

Figure 7:
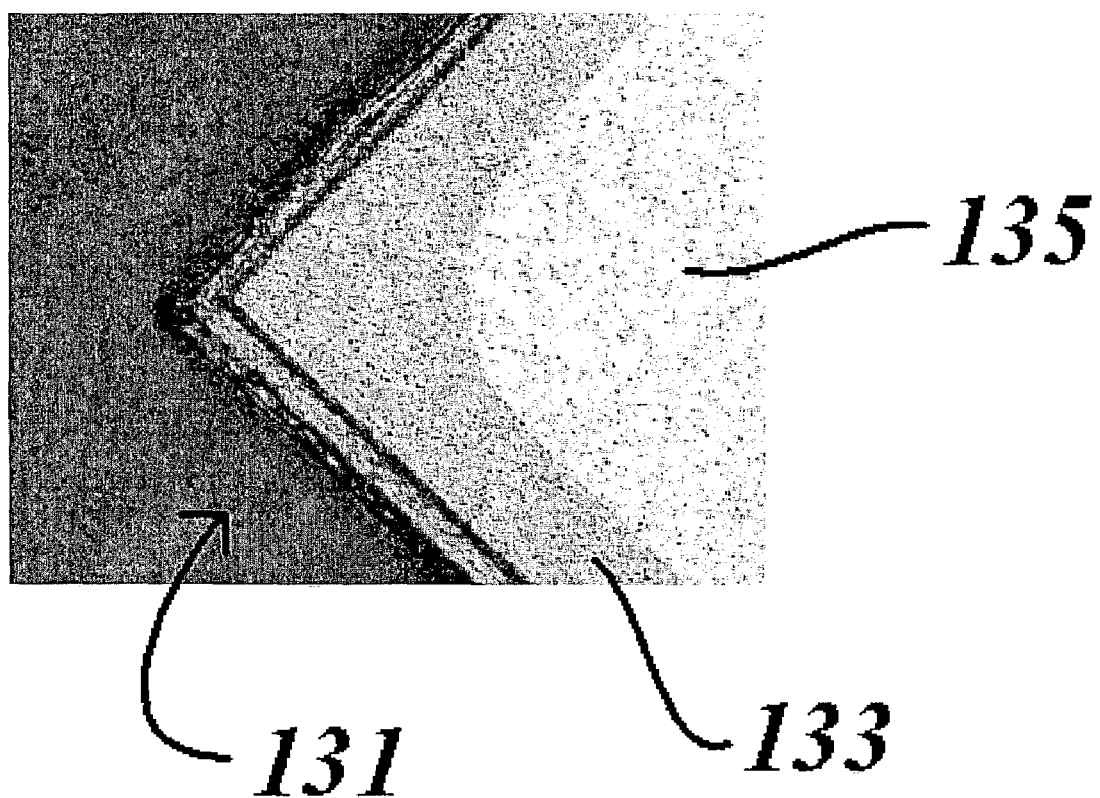
FIG. 7 is a micrograph of a die made in accordance with the teachings herein.
Figure 8:
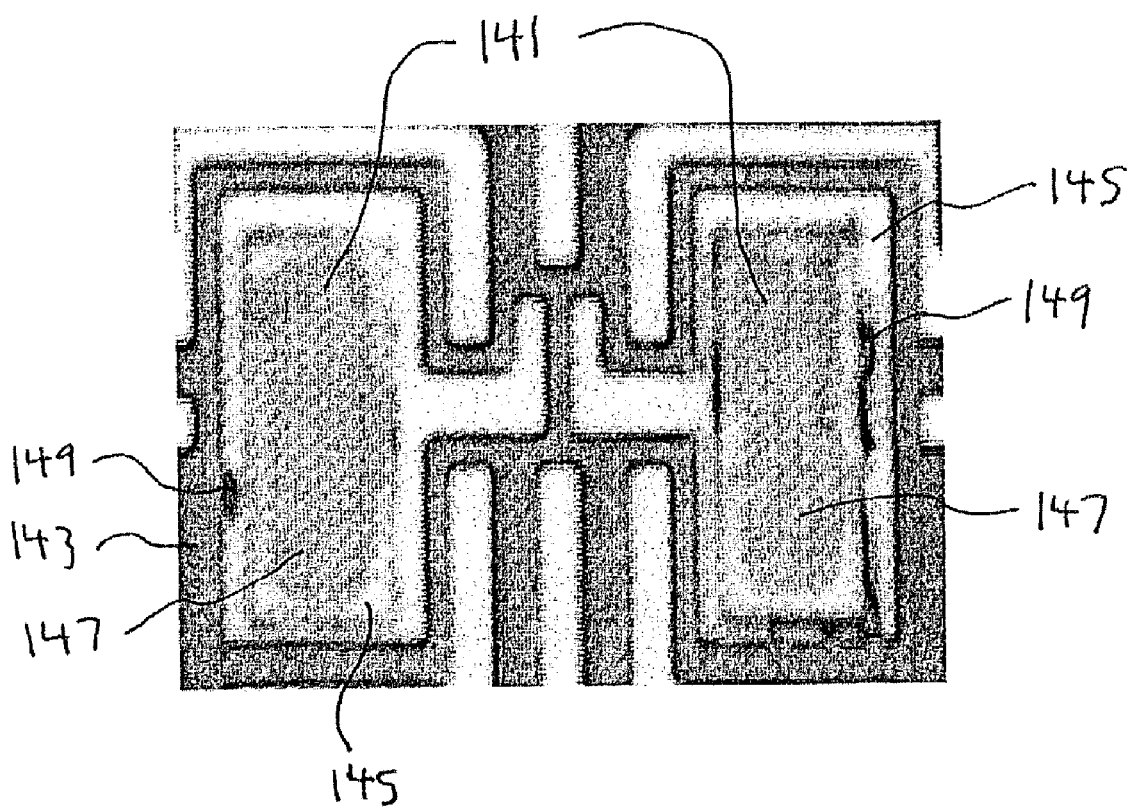
FIG. 8 is an acoustical micrograph of a semiconductor device made in accordance with the teachings herein.

The effectiveness of the layer of $TiO_2$ in the embodiment of FIG. 7 in resisting wetting by the solder is illustrated in FIG. 8. FIG. 8 is an acoustic micrograph of two die 141 of the type shown in FIG. 7 after their attachment to a substrate 143. The presence of the reflowed solder is indicated by the darker interior regions of the micrograph, while the lighter regions indicate a lack of solder. As seen therein, the layer of $TiO_2$ disposed about the perimeter of each die effectively prevents the solder from wetting that portion of the die (as shown by the white band 145 around the perimeter of each die), with the result that the solder bond 147 is confined to the interior of the die. In the particular example shown, the layer of TiO$_2$ was not made to extend completely around the beveled edge of the die. As a result, the gold backside metallization was exposed along the beveled edge, and some solder wetting occurred there, as shown by the darkened regions 149 on the outside of each die. However, one skilled in the art will appreciate that, by extending the TiO$_2$ layer completely around the edge of the die, solder wetting would be limited to the interior of the die.

Figure 9:
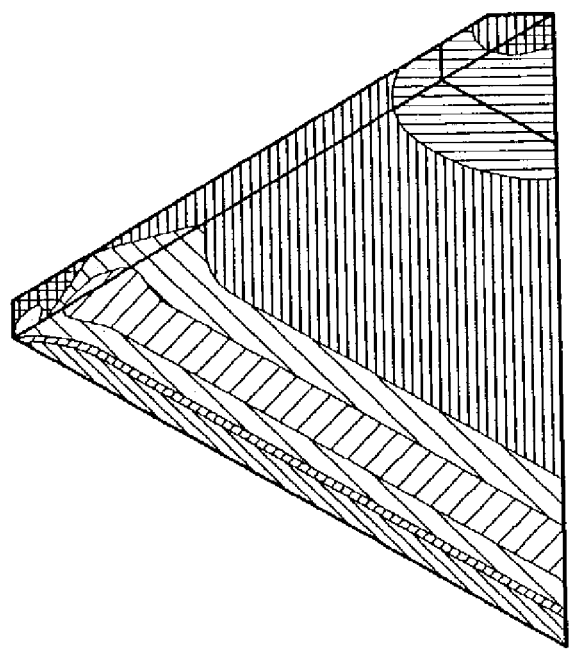
FIG. 9 is an illustration showing the shear stress profile in a prior art die.
Figure 10:
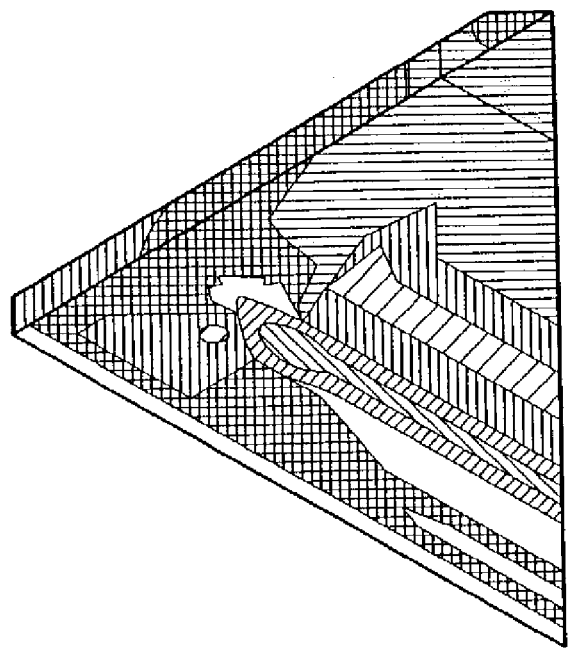
FIG. 10 is an illustration showing the shear stress profile for a die made in accordance with the teaching herein.

The effectiveness of the dewetting schemes disclosed herein in shifting shear stress maxima closer to the center of the die is illustrated in the stress profiles shown in FIGS. 9 and 10. These profiles were obtained from thermal stress simulations modeled for a 1 mil (25.4 micron) GaAs die coated with 0.7 mil (17.8 micron) gold as the backside metallization and having a 0.6 mil (15.2 micron) layer of AuSn solder as the die attach material. In the die giving rise to the stress profile of FIG. 9, no dewetting scheme was used, whereas in the die giving rise to the stress profile of FIG. 10, a layer of TiO$_2$ was disposed about the perimeter of the die as a dewetting agent.

The model used to generate the stress profiles assumes an AlN die pad having a thickness of 25 mil (635 microns), and a thermal cycle (from solder reflow to subsequent cooling) of 285° C. to 25° C. The stress profiles of FIGS. 9 and 10 show the stress in the front or top surface of the die (the surface of the die opposite the die attach surface) as modeled over the aforementioned thermal cycle.

The stresses shown in FIGS. 9 and 10 were manifested by the out-of-plane displacements resulting from contraction of the die during cooling and the attendant shear stress. FIG. 9 represents the stress profile for a conventional die (that is, a die not treated with a dewetting agent), and shows that shear stress is minimized along the center of the die (where contraction is minimal) and is maximized along or near the die perimeter (where contraction is greatest). Hence, in the absence of a dewetting scheme, stress maxima are seen to occur along or near the die perimeter. As previously noted, the perimeter of the die typically contains a number of crack propagation sites as a result of the dicing operation performed at the wafer level and, in the case of beveled die, is also where the die is thinnest. Hence, in the absence of a dewetting scheme of the type shown herein, shear stress maxima occur in the portion of the die most prone to crack propagation.

FIG. 10 illustrates the shear stress profile for a die employing a dewetting scheme of the type taught herein (in this case, the dewetting agent is a layer of titanium dioxide disposed along the perimeter of the die). As shown therein, the use of the dewetting scheme shifts the shear maxima closer to the center of the die where the die is better able to resist crack formation or propagation.

In the particular example modeled above, the dewetting scheme employs a dewetting agent which is disposed over portions of the metal backside layer where die attach is not desired. However, as previously noted, in other embodiments in which solder is used as the die attach material, a similar result (that is, the shifting of the shear stress maxima to the interior of the die) may be achieved through selective placement or removal of the backside metallization from the die such that no backside metallization exists along the perimeter of the die, and by the use of a solder composition that will wet only those portions of the die containing the backside metallization. Since solder compositions typically wet semiconductor materials poorly in the absence of a backside metallization, this approach can be used with a variety of solders and semiconductor die.

In the various embodiments and methodologies described above, the application of dewetting agents (or, as the case may be, the selective removal of the die metallization) has been primarily described with respect to the backside of the die. However, one skilled in the art will appreciate that the same type of methodologies may be applied to the front side of the die in applications where die attach is to occur there. Such applications include, for example, applications involving the stacking of die.

In embodiments where the die attach material is an adhesive, a shifting of the shear stress maxima to the interior of the die may be achieved through selective placement around the perimeter of the die of a material that is either not wet by the adhesive, or to which the adhesive does not bond strongly. Examples of such materials are described in greater detail below and include, for example, materials based on or containing fatty acids.

Various materials may be used as dewetting agents in various embodiments of the devices and methodologies in accordance with the teachings herein. The principle requirement of the dewetting agent is that it resists wetting by the die attach material, which is typically solder but may also be an adhesive such as a conductive epoxy.

When solder is used as the die attach material, refractory metals and metal oxides may be used as the dewetting agent in the devices and methodologies described herein, with the exact choice of metal or metal oxide being determined in part by the particular solder being used. Possible refractory metals include, for example, titanium, tungsten, rhenium, tantalum, molybdenum, niobium, vanadium and various alloys based on these metals, and possible alloys include alloys of these metals with each other and/or with non-refractory metals. One such alloy, for example, is NiV. Of these, the use of titanium (which subsequently oxidizes to TiO$_2$ after it is applied to a die surface) is especially preferred, especially with GaAs die, since its use in GaAs technology is well-characterized. In addition to TiO$_2$, possible metal oxides include, for example, nickel and copper oxides.

The refractory metal or metal oxide may be applied at almost any desired thickness. Since dewetting is primarily a surface phenomenon, the thickness of the layer of refractory metal or metal oxide is not usually overly critical in most applications. Typically, however, the refractory metal or metal oxide will be coated at thicknesses within the range of about 100 Å to about 2000 Å, preferably within the range of about 500 Å to about 1500 Å, more preferably within the range of about 750 Å to about 1250 Å, and most preferably within the range of about 900 Å to about 1100 Å.

Certain organic materials may also be used as dewetting agents when solder is used as the die attach material. These include several of the various materials employed as solder masks in the art, such as epoxy-based or anhydride-based resins. Specific non-limiting examples include esterified styrene-maleic anhydride copolymers, such as, for example, those esterified with hydroxyalkyl (meth)acrylate and/or alcohols (including monohydric alcohols), which copolymers may further include, or be reacted with, multifunctional (meth)acrylate monomers, multifunctional epoxides, and/or photoinitiators; the reaction products of esterified epoxy resins with polybasic acid anhydrides; and mixtures or reaction products of polyhydroxyethers with melamine formaldehyde.

Various dewetting agents may be used when the die attach material is an adhesive. Examples of such agents include, for example, fatty acids, which may be applied by (a) applying a treatment solution comprising a fatty acid compound, an alkalizing agent, and a solvent comprising water and from about 5% by volume to about 90% by volume of an organic solvent selected from the group consisting of alcohol, glycol ether, and combinations thereof to the surface, and then (b) removing substantially all of the solvent from the solution to provide a thin film on the surface of said substrate. The film comprises the fatty acids that were present in the treatment solution. Substrates (including die having a backside metallization thereon) having a film comprising a fatty acid compound on the surface thereof are less wettable with respect to the organic liquids that are normally present in the adhesives that are frequently used for die attach.

Various die attach materials are known to the art and may be used in the devices and methodologies described herein, including both solders and organic-based adhesives.

Suitable solders that may be used for die attach in accordance with the teachings herein include both eutectic and non-eutectic solders. Such solders may be based on a variety of materials or alloys, including, for example, Sn—Pb, Sn—Pb—Ag, Sn—Ag—Cu, Sn—Ag, Sn—Cu—Ni, Sn—Sb, Sn—Pb—Ag—Sb, Sn—Pb—Sb, Sn—Bi—Ag—Cu, Sn—Cu, AuSn, and AuSi. Of these, the use of AuSn is especially preferred in applications involving GaAs die. Organic-based adhesives that may be used as die attach materials in the devices and methodologies described herein include polymeric adhesives such as epoxies and polyacrylates.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A semiconductor device, comprising:
   a substrate;
   a die having a first surface which is attached to said substrate by way of a die attach material comprising an adhesive; and
   a dewetting agent disposed around the entire perimeter of the die;
   wherein said dewetting agent comprises a fatty acid and is resistant to wetting by said die attach material.

2. The semiconductor device of claim 1, wherein the first surface has a metallization layer thereon, and wherein the metallization layer is not present in said portion of the perimeter of the die that is resistant to wetting by said die attach material.

3. The semiconductor device of claim 1, wherein the die has a plurality of sawn edges.

4. The semiconductor device of claim 1, wherein said substrate is a packaging substrate.

5. A semiconductor device, comprising:
   a packaging substrate;
   a die having a first surface which is attached to said packaging substrate by way of an adhesive; and
   a source via;
   wherein at least a portion of the perimeter of the first surface of the die has a dewetting agent disposed thereon, wherein said dewetting agent comprises a fatty acid, and wherein said dewetting agent is disposed about said source via.

6. The semiconductor device of claim 5, wherein said die comprises GaAs.

7. The semiconductor device of claim 5, wherein said dewetting agent has a first portion which is disposed as a band around the perimeter of the die, and a second portion, separate from the first portion, which is disposed about said source via.

8. The semiconductor device of claim 5, wherein the die has a thickness of less than about 40 microns.

9. The semiconductor device of claim 5, wherein said dewetting agent is disposed about the entire perimeter of said first surface of said die.

10. A semiconductor device, comprising:
    a packaging substrate; and
    a die equipped with a source via and having a first surface which is attached to said packaging substrate by way of an adhesive;
    wherein the die has a dewetting agent disposed thereon which comprises a fatty acid and which is disposed on the first surface as first and second separate portions, wherein said first portion is disposed as a band around the perimeter of the die, and wherein said second portion is disposed about said source via.

11. The semiconductor device of claim 5, wherein the die has a plurality of sawn edges, and wherein the dewetting agent is disposed along the perimeter of each of said plurality of sawn edges.

12. The semiconductor device of claim 10, wherein the die has a plurality of sawn edges, and wherein the dewetting agent is disposed along the perimeter of each of said plurality of sawn edges.

13. The semiconductor device of claim 1, wherein said die comprises GaAs.

14. The semiconductor device of claim 10, wherein said die comprises GaAs.

15. The semiconductor device of claim 1, further comprising a source via, and wherein said dewetting agent is also disposed around said source via.

16. The semiconductor device of claim 15, wherein said dewetting agent has a first portion which is disposed as a band around the perimeter of the die, and a second portion, separate from the first portion, which is disposed about said source via.

17. The semiconductor device of claim 1, wherein the die has a thickness of less than about 40 microns.

18. The semiconductor device of claim 10, wherein the die has a thickness of less than about 40 microns.

19. The semiconductor device of claim 5, wherein said first surface has a metallization layer thereon, and wherein said metallization layer is not present in said portion of the perimeter of the die that is resistant to wetting by said die attach material.

20. The semiconductor device of claim 10, wherein said first surface has a metallization layer thereon, and wherein said metallization layer is not present in said portion of the perimeter of the die that is resistant to wetting by said die attach material.

* * * * *